United States Patent
Sakumoto

(10) Patent No.: US 9,470,402 B2
(45) Date of Patent: Oct. 18, 2016

(54) LIGHT-EMITTING APPARATUS

(75) Inventor: Daisuke Sakumoto, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 312 days.

(21) Appl. No.: 14/239,758

(22) PCT Filed: Aug. 22, 2012

(86) PCT No.: PCT/JP2012/071166
§ 371 (c)(1),
(2), (4) Date: Feb. 19, 2014

(87) PCT Pub. No.: WO2013/035529
PCT Pub. Date: Mar. 14, 2013

(65) Prior Publication Data
US 2014/0192542 A1  Jul. 10, 2014

(30) Foreign Application Priority Data

Sep. 8, 2011 (JP) .................................. 2011-196271

(51) Int. Cl.
| | |
|---|---|
| *F21V 21/00* | (2006.01) |
| *H01L 33/60* | (2010.01) |
| *F21V 21/002* | (2006.01) |
| *H01L 33/48* | (2010.01) |

(52) U.S. Cl.
CPC ............. *F21V 21/002* (2013.01); *H01L 33/60* (2013.01); *H01L 33/486* (2013.01); *H01L 2224/16225* (2013.01)

(58) Field of Classification Search
CPC ...... H05K 7/00; H05K 13/00; F21V 21/002; H01L 33/60; H01L 33/486; H01L 2224/16225
USPC ......................................................... 361/760
See application file for complete search history.

(56) References Cited

U.S. PATENT DOCUMENTS

| | | | |
|---|---|---|---|
| 2009/0045423 A1 | 2/2009 | Hashimoto et al. | |
| 2009/0295265 A1* | 12/2009 | Tabuchi .................. | H01L 33/56 313/112 |

(Continued)

FOREIGN PATENT DOCUMENTS

| | | |
|---|---|---|
| JP | 49109478 U | 9/1974 |
| JP | 11074561 A | 3/1999 |

(Continued)

OTHER PUBLICATIONS

Japanese Office Action with Statement of Relevance of Non-English References, Japanese Patent Appln. No. 2013-532528, Mar. 11, 2014, 4 pp.

(Continued)

*Primary Examiner* — Eric Thomas
*Assistant Examiner* — Michael P McFadden
(74) *Attorney, Agent, or Firm* — Volpe and Koenig, P.C.

(57) ABSTRACT

A light-emitting apparatus includes a substrate warped as a whole of which a central portion is most highly raised; a light-emitting device mounted on the central portion of the substrate; a support member disposed on the substrate so as to surround the light-emitting device; and a frame body disposed on the support member so as to surround the light-emitting device, the frame body including part connected to the support member and part not connected to the support member, the part not connected to the support member being left spaced from an upper surface of the substrate. Moreover, the light-emitting apparatus is constituted so that a level of a lower surface of the light-emitting device is higher than a level of a lower surface of the frame body.

5 Claims, 6 Drawing Sheets

(56) References Cited

U.S. PATENT DOCUMENTS

| | | | |
|---|---|---|---|
| 2012/0229999 A1* | 9/2012 | Hussain | G01R 31/2886 361/783 |
| 2015/0229999 A1* | 8/2015 | Steading | H04N 5/44543 725/40 |

FOREIGN PATENT DOCUMENTS

| | | |
|---|---|---|
| JP | 2004289106 A | 10/2004 |
| JP | 2006156643 A | 6/2006 |
| JP | 2006269485 A | 10/2006 |
| JP | 2007184319 A | 7/2007 |
| JP | 2008263082 A | 10/2008 |
| JP | 2009170362 A | 7/2009 |
| JP | 2009182072 A | 8/2009 |
| JP | 2010092973 A | 4/2010 |

OTHER PUBLICATIONS

International Search Report, PCT/JP2012/071166, Sep. 5, 2012, 2pp.

* cited by examiner

US 9,470,402 B2

LIGHT-EMITTING APPARATUS

FIELD OF INVENTION

The present invention relates to a light-emitting apparatus including a light-emitting device.

BACKGROUND

In recent years, the developments of light-emitting apparatuses having a light-emitting device have been pursued. Such a light-emitting apparatus is noteworthy in terms of power consumption or product lifetime. By way of example, there is a light-emitting apparatus in which a frame body, which is mounted on a substrate for surrounding a light-emitting device, is spaced from the upper surface of the substrate (refer to Japanese Unexamined Utility Model Publication JP-U 49-109478 (1974), for example). However, in the presence of a spacing between the upper surface of the substrate and the lower surface of the frame body, light emitted from the light-emitting device cannot be reflected satisfactorily from the frame body, which poses the possibility of decrease in amount of light to be emitted to an exterior.

An object of the invention is to provide a light-emitting apparatus capable of enhancement in brightness, in which light emitted from a light-emitting device can be efficiently reflected from a frame body to increase an amount of light to be emitted to an exterior.

SUMMARY

Disclosure of Invention

A light-emitting apparatus in accordance with the embodiment of the invention comprises: a substrate warped as a whole of which a central portion is most highly raised; a light-emitting device mounted on the central portion of the substrate; a support member disposed on the substrate so as to surround the light-emitting device; and a frame body disposed on the support member so as to surround the light-emitting device, the frame body including part connected to the support member and part not connected to the support member, the part not connected to the support member being left spaced from an upper surface of the substrate. Moreover, the light-emitting apparatus is constituted so that a level of a lower surface of the light-emitting device is higher than a level of a lower surface of the frame body.

DETAILED DESCRIPTION OF THE PREFERRED EMBODIMENTS

Hereinafter, embodiments of a light-emitting apparatus pursuant to the invention will be described with reference to the accompanying drawings. It should be noted that the invention is not limited to the embodiments as set forth hereunder.

<General Structure of Light-Emitting Apparatus>

Figure 1:
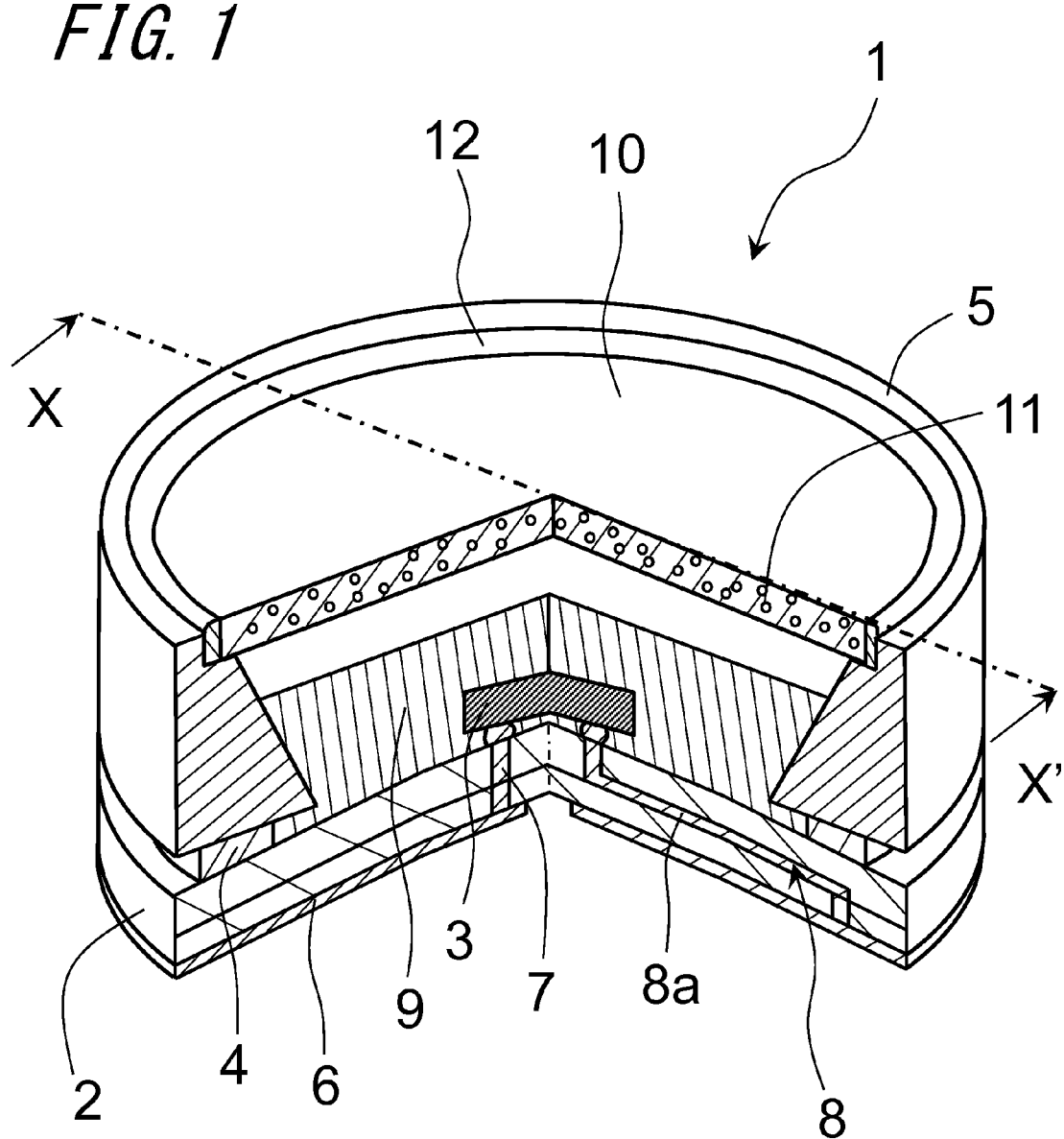
FIG. 1 is a perspective sectional view showing an overview of a light-emitting apparatus in accordance with one embodiment of the invention.
Figure 2:
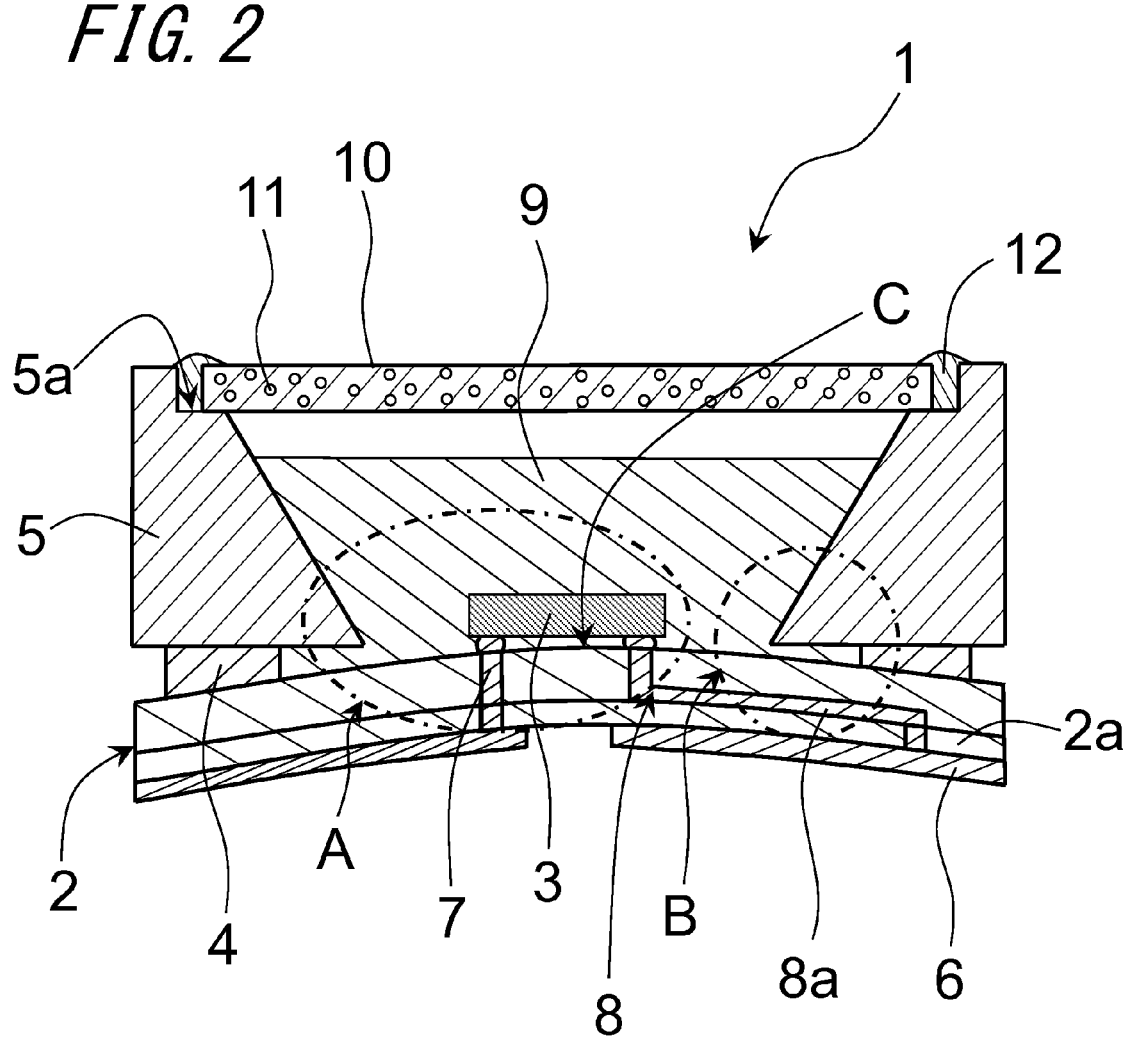
FIG. 2 is a sectional view of the light-emitting apparatus taken along the line X-X' of FIG. 1.
Figure 3:
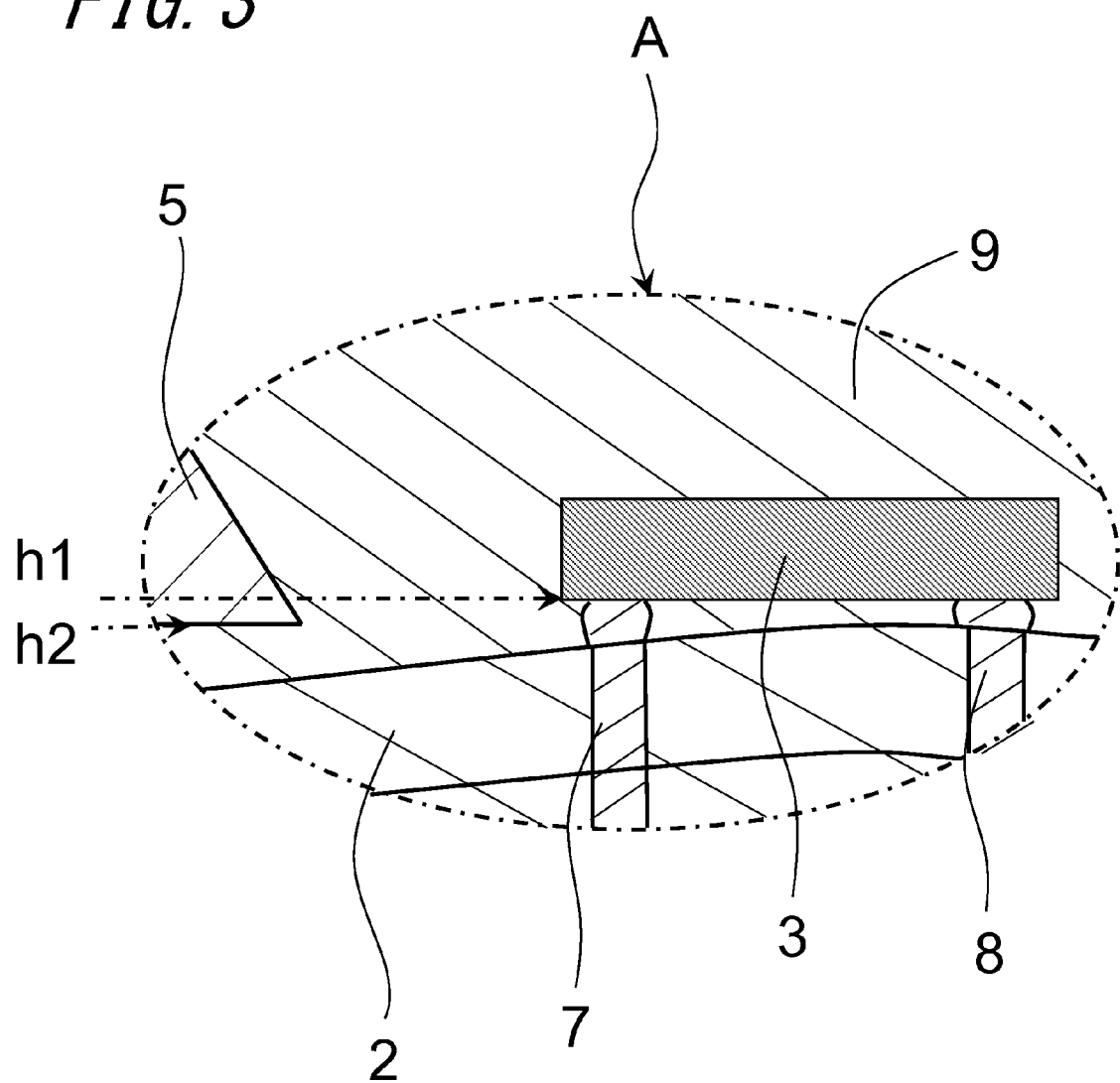
FIG. 3 is an enlarged sectional view of a part A of FIG. 2.
Figure 4:
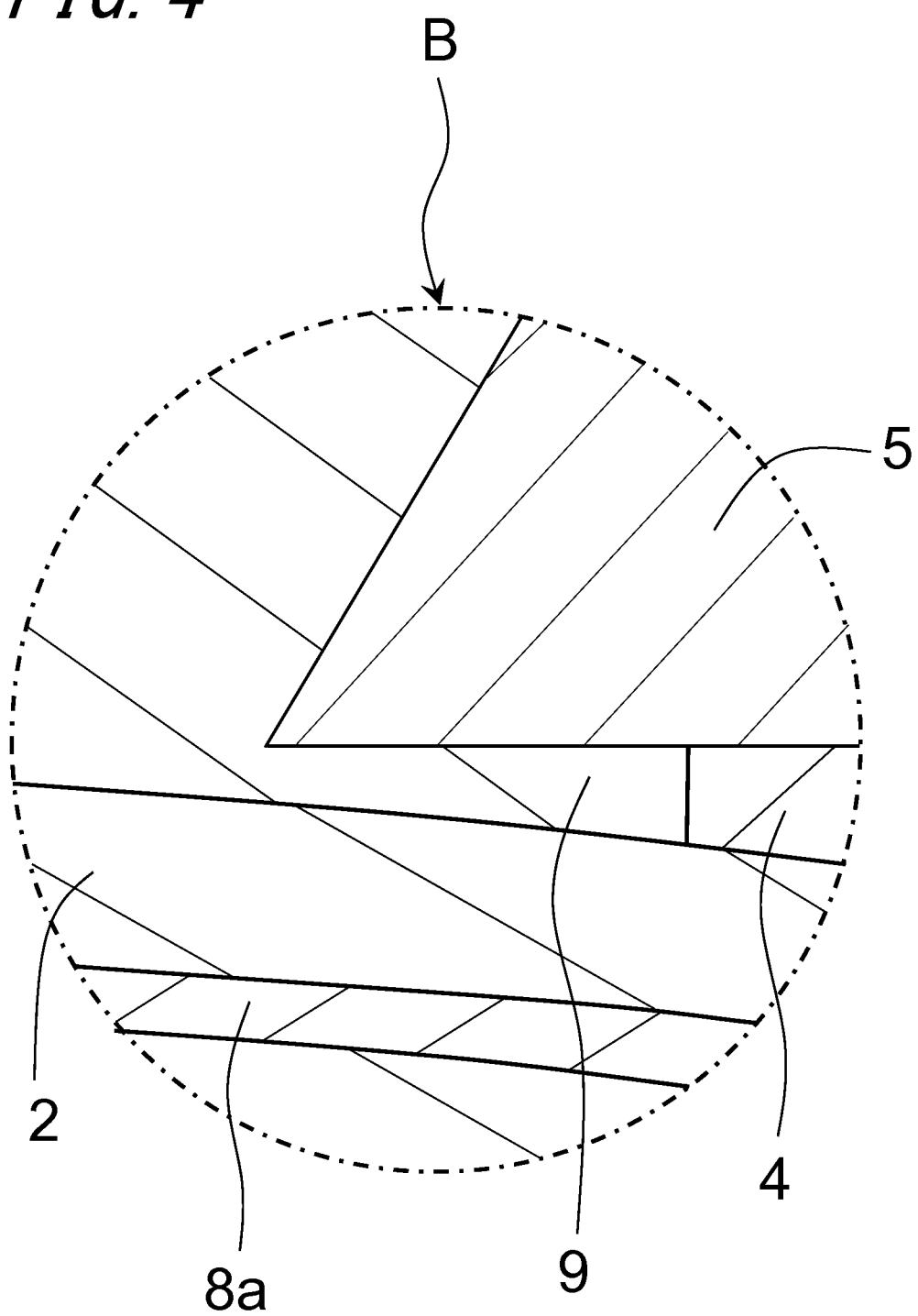
FIG. 4 is an enlarged sectional view of a part B of FIG. 2.
Figure 5:
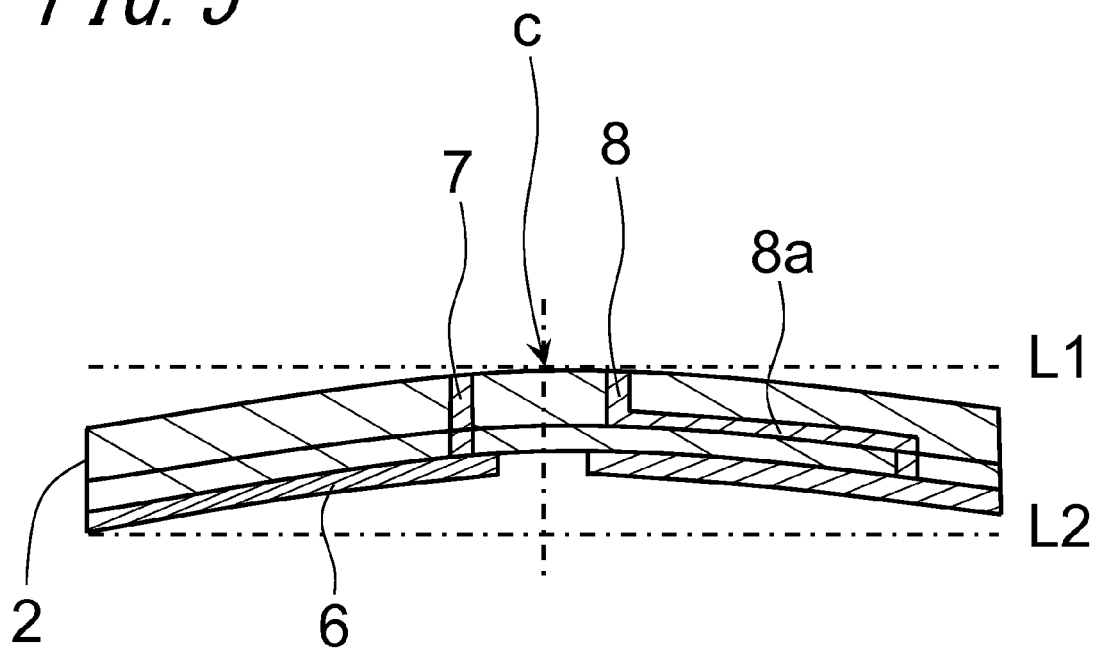
FIG. 5 is a sectional view showing a substrate of FIG. 2.
Figure 6:
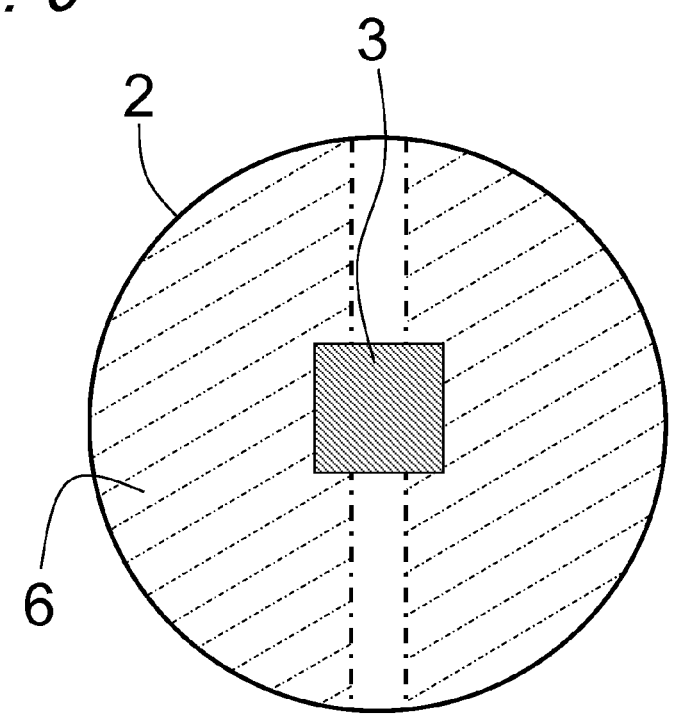
FIG. 6 is a see-through plan view of the light-emitting apparatus in accordance with one embodiment of the invention, showing a positional relationship between a light-emitting device and a pair of metallization layers.

FIG. 1 is an external perspective view of a light-emitting apparatus in accordance with an embodiment of the invention, with part thereof shown in section. FIG. 2 is a sectional view of the light-emitting apparatus taken along the line X-X' shown in FIG. 1. FIG. 3 is an enlarged sectional view of a part A of the light-emitting apparatus shown in FIG. 2. FIG. 4 is an enlarged sectional view of a part B of the light-emitting apparatus shown in FIG. 2. FIG. 5 is a sectional view showing a substrate of the light-emitting apparatus shown in FIG. 2. Note that the alternate long and short dashed lines shown in FIG. 5 are imaginary lines for indicating the heightwise positions, or levels of the substrate along a planar direction, and more specifically an imaginary line L1 conforming to the center of the substrate and an imaginary line L2 conforming to one end of the lower surface of the substrate 2. FIG. 6 is a see-through plan view of the light-emitting apparatus, showing a relationship between a light-emitting device disposed on the upper surface of the substrate and a pair of metallization layers disposed on the lower surface of the substrate. Note that the alternate long and short dashed lines shown in FIG. 6 indicate the region where the metallization layer is formed.

The light-emitting apparatus 1 comprises: a substrate 2 warped as a whole of which a central portion C is most highly raised; a light-emitting device 3 mounted on the central portion C of the substrate 2; a support member 4 disposed on the substrate 2 so as to surround the light-emitting device 3; and a frame body 5 disposed on the support member 4 so as to surround the light-emitting device 3, the frame body 5 including part connected to the support member 4 and part not connected to the support member 4, the part not connected to the support member being left spaced from the upper surface of the substrate 2. Moreover, the light-emitting apparatus 1 is constituted so that a heightwise position, or level h1 of the lower surface of the light-emitting device 3 is higher than a heightwise position, or level h2 of the lower surface of the frame body 5. For example, the light-emitting device 3 is a light-emitting diode for giving forth light to an exterior by exploiting electron-positive hole reunion in a semiconductor p-n junction.

The substrate 2 is warped as a whole so that the central portion C can be raised. The substrate 2 is an insulating substrate made of, for example, a ceramic material such as alumina or mullite, or a glass ceramic material, or alternatively a composite material of a mixture of two or more of the above materials. Also, a polymeric resin containing metal oxide fine particles in a dispersed state for adjustment of the thermal expansion of the substrate 2 can be used for the substrate 2. The substrate 2 is constructed by placing a plurality of laminated ceramic layers 2a on an external substrate warped of which a central portion is most highly raised, and then firing them integrally. For example, the thermal expansion coefficient of the substrate 2 is adjusted to fall in a range of $4\times10^{-6}$/K or more and $8\times10^{-6}$/K or less.

The substrate 2 is circular in a plan view, and its diameter is adjusted to fall in a range of 2 mm or more and 20 mm or less, for example. Alternatively, the substrate 2 is rectangular in a plan view, and the length of one side thereof is adjusted to fall in a range of 2 mm or more and 20 mm or less, for example. Moreover, the thickness of the substrate 2 in a vertical direction is adjusted to fall in a range of 0.3 mm or more and 3 mm or less, for example. In the substrate 2, part of the upper surface which corresponds to the central portion C is located above other nearby part of the upper surface. The level of the central portion C of the upper surface of the substrate 2 is 0.05 mm or more and 0.5 mm or less higher than the level of the end of the upper surface of the substrate 2.

On the lower surface of the substrate 2 is disposed a pair of metallization layers 6. One of the paired metallization layers 6 is electrically connected to one electrode of the light-emitting device 3, whereas the other one of them is electrically connected to the other electrode of the light-emitting device 3. When the lower surface of the substrate 2 is seen in a plan view, the metallization layers 6 are arranged in symmetrical configuration. The metallization layer 6 is formed from a region in overlapping relation to the central portion C of the substrate 2 to the end of the substrate 2. Alternatively, where the metallization layer 6 has the same outer shape as the substrate 2, since a stress caused by the difference in thermal expansion between the substrate 2 and the metallization layer 6 can be dispersed without being concentrated on differently configured parts thereof, it is possible to prevent occurrence of cracking in the substrate 2 and separation of the metallization layer 6.

The metallization layer 6 is made of an electrically conducting material such for example as tungsten, molybdenum, manganese, copper, aluminum, silver, gold, or platinum. For example, the metallization layer 6 can be obtained by printing a metal paste, which is prepared by admixing an organic solvent in powder of tungsten or the like, in a predetermined pattern on a ceramic green sheet for constituting the substrate 2, with subsequent firing process. The thickness of the metallization layer 6 in the vertical direction is adjusted to fall in a range of 0.5 µm or more and 50 µm or less, for example. For example, the thermal expansion coefficient of the metallization layer 6 is adjusted to fall in a range of $10 \times 10^{-6}$/K or more and $20 \times 10^{-6}$/K or less.

Figure 7:
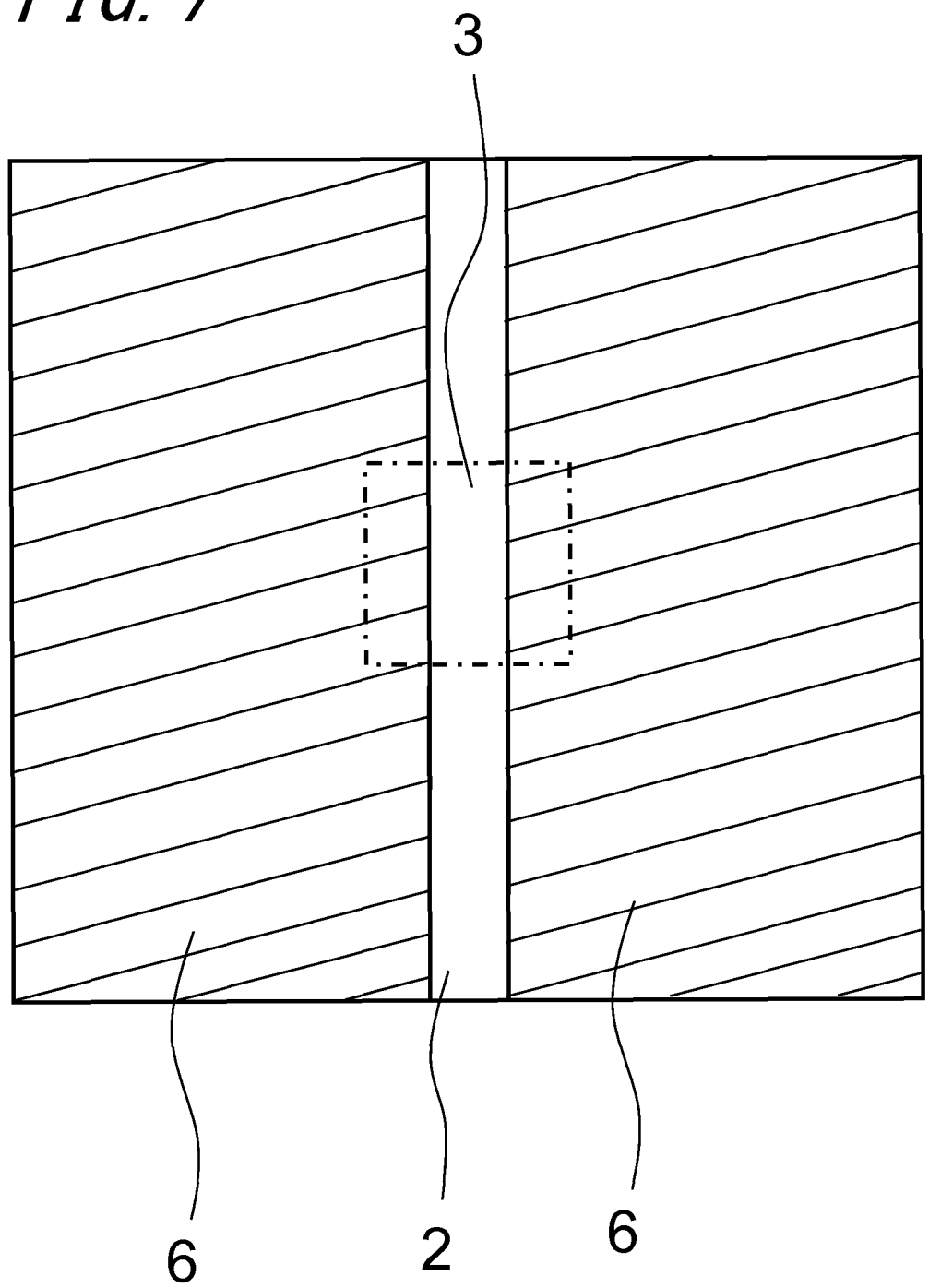
FIG. 7 is a bottom view of the light-emitting apparatus in accordance with the embodiment, showing a patterning for the metallization layer.

As shown in FIG. 7, the metallization layers 6 are disposed on the lower surface of the substrate 2. The paired metallization layers 6 are spaced apart on the lower surface of the substrate 2. The metallization layers 6 are formed on the lower surface of the substrate 2 by defining patterns in the entire lower surface of the substrate 2, except for a region corresponding to the centerline of the substrate 2 as seen in a plan view. The spacing between the metallization layers 6 is adjusted to fall in a range of 0.5 mm or more and 3 mm or less, for example. In forming the substrate 2, by printing a pair of metallization layers 6 onto the lower surface of a substrate 2 in an unfired condition and firing the unfired substrate 2, it is possible to cause the substrate 2 to become warped as a whole with the utilization of the difference in thermal expansion between the substrate 2 and the metallization layer 6. Since the lower surface of the substrate 2 is formed with the metallization layers 6 that are larger in thermal expansion coefficient than the substrate 2, it follows that the substrate 2 is warped as a whole so as to be convexly curved upwardly. At this time, by virtue of the spacing between the paired metallization layers 6, during thermal expansion and contraction, a stress is allowed to escape from the space between the paired metallization layers 6, wherefore the metallization layer 6 can be restrained against separation from the lower surface of the substrate 2. Where specific examples of the substrate 2 and the metallization layer 6 are concerned, when they are seen in a plan view, the length of one side of the substrate 2 is set at 5 mm; the length of the space between the metallization layers 6 is set at 1 mm; the longer side of the metallization layer 6 is set at 5 mm; and the shorter side of the metallization layer 6 is set at 2 mm. Moreover, the thickness of the substrate 2 in the vertical direction is set at 1 mm, and the thickness of the metallization layer 6 in the vertical direction is set at 20 µm.

The substrate 2 has thereinside an electrical conductor 8 for providing electrical connection between the light-emitting device 3 and the metallization layer 6. The electrical conductor 8 includes electrically conductive members such as a through conductor 7, an interlayer conductor 8a, and so forth disposed in the substrate 2. Disposed in the substrate 2 is the through conductor 7 acting as one portion of the electrical conductor 8 for permitting electrical conduction between the inside and outside of the substrate 2. The through conductor 7 provides electrical connection between one electrode of the light-emitting device 3 and one of the metallization layers 6. The through conductor 7 is made of an electrically conducting material such for example as tungsten, molybdenum, manganese, copper, aluminum, silver, gold, or platinum. The through conductor 7 can be obtained by printing, on the substrate 2 which has yet to be fired but has been machined by means of punching or lasering for example, a metal paste prepared by admixing an organic solvent in powder of tungsten or the like, with subsequent firing process.

The through conductor 7 is disposed in the central portion C. The through conductor 7 has the form of a cylindrical body extending continuously from the upper surface of the substrate 2 to the lower surface thereof. The through conductor 7 has its upper part connected to the light-emitting device 3, and has its lower part connected to the metallization layer 6. In the through conductor 7, the diameter of the cylindrical body is adjusted to fall in a range of 0.05 mm or more and 0.5 mm or less, for example.

Also disposed in the substrate 2 is the other portion of the electrical conductor 8 for providing electrical connection between the other electrode of the light-emitting device 3 and the other metallization layer 6. Part of the other portion of the electrical conductor 8 serves as the interlayer conductor 8a. The interlayer conductor 8a is disposed along the interlayer within the substrate 2. The interlayer conductor 8a, which is part of the other portion of the electrical conductor 8, extends from a region in overlapping relation to the light-emitting device 3 to a region in non-overlapping relation to the light-emitting device 3. The electrical conductor 8 is made of an electrically conducting material such for example as tungsten, molybdenum, manganese, copper, aluminum, silver, gold, or platinum. The electrical conductor 8 can be obtained by preparing at least two yet-to-be-fired ceramic layers 2a, subjecting each of the layers to punching or lasering operation, printing a metal paste prepared by admixing an organic solvent in powder of tungsten or the like in predetermined patterns on the layers, and performing firing thereon.

One electrode of the light-emitting device 3 is electrically connected to the through conductor 7 acting as one portion of the electrical conductor 8, and the other electrode of the light-emitting device 3 is electrically connected to the other portion of the electrical conductor 8. As to the substrate 2, one portion of the electrical conductor 8 and the other portion of the electrical conductor 8 disposed in the substrate are arranged in asymmetrical configuration within the substrate 2 as viewed in section, wherefore the substrate 2 can be thermally deformed so as to be warped better as a whole, and also the extent of warpage in the substrate 2 and the shape of the warp of the substrate 2 can be controlled as intended. Moreover, so long as the substrate 2 is asymmetrical about the center thereof as viewed in section, when a plurality of substrates 2 are stored in storage places such as a tray in predetermined arrangement, it is possible to detect some substrates 2 that have failed to be arranged in a desired direction due to the inclinations of the substrates 2 in different directions or the displacements of the upper part of the through conductor 7 and the electrical conductor 8 in different directions that may occur during storage, as well as to correct the direction of storage of the substrate 2 with ease, without the necessity of providing a direction-indicating marker or the like in the substrate 2.

The light-emitting device 3 is mounted on the central portion C of the substrate 2. The light-emitting device 3 is electrically connected to the upper part of the through conductor 7 and the upper part of the electrical conductor 8 left exposed at the central portion C of the substrate 2 via a brazing material or a solder, for example.

The light-emitting device 3 comprises a light-transmittable base body and an optical semiconductor layer formed on the light-transmittable base body. The light-transmittable base body may be of any given type insofar as it is capable of the growth of an optical semiconductor layer by means of chemical vapor deposition, for example, metalorganic vapor deposition technique or molecular beam epitaxial growth technique. Examples of the material used for the light-transmittable base body include sapphire, gallium nitride, aluminum nitride, zinc oxide, zinc selenide, silicon carbide, silicon, and zirconium diboride. The thickness of the light-transmittable base body falls in a range of 50 µm or more and 1000 µm or less.

The optical semiconductor layer is composed of a first semiconductor layer formed on the light-transmittable base body, a light-emitting layer formed on the first semiconductor layer, and a second semiconductor layer formed on the light-emitting layer.

For example, Group-III nitride semiconductor, Group III-V semiconductor such as gallium phosphide or gallium arsenide, or Group III nitride semiconductor such as gallium nitride, aluminum nitride, or indium nitride can be used for the first semiconductor layer, the light-emitting layer, and the second semiconductor layer. The thickness of the first semiconductor layer falls in a range of 1 µm or more and 5 µm or less, for example; the thickness of the light-emitting layer falls in a range of 25 nm or more and 150 nm or less, for example; and the thickness of the second semiconductor layer falls in a range of 50 nm or more and 600 nm or less, for example. Moreover, as the light-emitting device 3 thusly constructed, for example, an element capable of giving forth excitation light ranging in wavelength from 370 nm or more and 420 nm or less can be employed.

The support member 4 is disposed on the substrate 2 so as to surround the central portion C. The support member 4 is intended to support the frame body 5. In the support member 4, even if the substrate 2 exhibits variations in upper-surface level between one end and the other end thereof, adjustment of vertical thickness can be effected on a substrate 2-contact area-by-substrate 2-contact area basis, wherefore the upper surface of the support member 4 can be maintained at a predetermined uniform level. As used herein, the term "uniform level" refers to a level where the height of the upper surface of the support member 4 conforms to the height of the lower surface of the frame body 5.

The support member 4 is disposed on the substrate 2 by, for example, sputtering or print-coating. The support member 4 is made of a light-transmittable material such for example as silicone resin, epoxy resin, or glass. The support member 4, being a member obtained by curing a material in a softened state, becomes deformed in conformity with the level of the upper surface of the substrate 2, so that the lower surface of the frame body 5 can be maintained at a uniform level. The vertical thickness of the support member 4 is adjusted to fall in a range of 0.05 mm more and 0.5 mm or less, for example.

The support member 4 is deposited in a softened state on the substrate 2, and, after the frame body 5 is placed thereon, the softened member is thermally cured. In this way, the support member 4 permits the frame body 5 to be fixed on the substrate 2.

When the substrate 2 is warped as a whole, the ends of the upper surface of the substrate 2 as viewed in section tend to be positioned at different levels in asymmetrical relation. Then, by disposing the frame body 5 at the ends of the upper surface of the substrate 2 by using the support member 4 which is freely deformable in an uncured state, it is possible to avoid that the level of the lower surface of the frame body 5 will be inclined at an undesirable angle relative to the light-emitting device 3. As a result, the frame body 5 can be fixed on the substrate 2 in a desired manner relative to the light-emitting device 3 situated on the substrate 2. As used herein, the term "section" refers to the section which passes through the center of the substrate 2 and is perpendicular to the upper surface of the substrate 2.

Moreover, it is preferable that, when the light-emitting apparatus 1 is viewed in section from side, in the support member 4, a part thereof which lies in a wider part of the space between the upper surface of the substrate 2 and the lower surface of the frame body 5 is larger in thickness than a part thereof which lies in a narrower part of the space between the upper surface of the substrate 2 and the lower surface of the frame body 5. In this case, even if a sealing member 9, which is filled into a gap at the wider part of the space between the upper surface of the substrate 2 and the lower surface of the frame body 5, undergoes thermal expansion, since the support member 4 having a larger thickness permits firm bonding of the frame body 5 to the substrate 2, it is possible to avoid separation of the frame body 5 from the substrate 2, and also, since the sealing member 9 is thermally deformed in a direction toward the wider part of the space between the upper surface of the substrate 2 and the lower surface of the frame body 5, it follows that a stress developed in the sealing member 9 is dispersed while being lessened within the sealing member 9. As a result, the sealing member 9 can be restrained against separation from the substrate 2 and the frame body 5.

The frame body 5 is disposed on the support member 4 so as to surround the light-emitting device 3 situated on the substrate 2. The frame body 5 is provided independently of the substrate 2. By configuring the frame body 5 so that its inner wall has a circular shape as seen in a plan view, it is possible to cause light emitted from the light-emitting device 3 to reflect in every direction and radiate out.

The frame body 5 is made of, for example, a ceramic material such as alumina or mullite, or a glass ceramic material, or alternatively a composite material of a mixture of two or more of the above materials. Also, the frame body 5 may be made of a porous material obtained by molding a ceramic material such as aluminum oxide, titanium oxide, zirconium oxide, or yttrium oxide into a predetermined shape, with subsequent sintering process. In the case of forming the frame body 5 from the porous material, light emitted from the light-emitting device 3 can be diffusely reflected from the surface of the porous material-made frame body 5.

Moreover, the inner wall of the frame body 5 is inclined to provide a bevel such that the region surrounded with the frame body 5 becomes wider from bottom to top, and, the upper end of the frame body 5 is internally stepped to provide a shoulder 5a. The inner wall of the frame body 5 may be formed with a metallic layer made for example of tungsten, molybdenum, copper, or silver. The metallic layer acts to reflect light emitted from the light-emitting device 3.

Moreover, the angle of inclination of the inner wall of the frame body 5 is adjusted to fall in a range of 55 degrees or more and 70 degrees or less, for example, with respect to the lower surface of the frame body 5. This helps facilitate upward reflection of light traveling in the planar direction along the lower surface of the frame body 5. Furthermore, the surface roughness of the metallic plating layer is adjusted to fall in a range of 1 μm or more and 3 μm or less in terms of arithmetic mean roughness Ra.

The shoulder 5a of the frame body 5 acts to support a wavelength conversion member 10. The shoulder 5a, which is formed by cutting part of the top of the frame body 5 inwardly, extends continuously circumferentially of the inner periphery of the frame body 5 for supporting the edge of the wavelength conversion member 10.

The level h2 of the lower surface of the frame body 5 is lower than the level h1 of the lower surface of the light-emitting device 3. Light emitted from the light-emitting device 3 radiates out from both the upper surface and the side surface of the light-emitting device 3. Where the substrate 2 is warped so that the central portion C is convexly curved upwardly, the level of the position where the light-emitting device 3 is mounted can be raised correspondingly. The light traveling toward the frame body 5 from the side surface of the light-emitting device 3 is reflected from the inner wall of the frame body 5 for further upward travel, and it is thus possible to increase light which is taken out of the light-emitting apparatus 1 through the wavelength conversion member 10, and thereby achieve enhancement in brightness.

In the range of the lower surface of the frame body 5, the parts other than the part contacted by the support member 4 are spaced from the upper surface of the substrate 2. The region surrounded with the frame body 5 is filled with the light-transmittable sealing member 9. The sealing member 9 acts to seal the light-emitting device 3 and to allow light emitted from the light-emitting device 3 to pass therethrough.

Since the sealing member 9 is filled into the space between the upper surface of the substrate 2 and the lower surface of the frame body 5, it is possible to increase the strength of adhesion between the substrate 2 and the frame body 5, and thereby prevent the frame body 5 from being separated from the substrate 2 effectively. Moreover, since the substrate 2 is warped as a whole, in the range of the lower surface of the frame body 5, the space between the lower surface of the frame body 5 and the upper surface of the substrate 2 becomes larger from one side closer to the light-emitting device 3 toward the other side away from the light-emitting device 3. As a result, the sealing member 9 can be filled from the narrower part of the space between the lower surface of the frame body 5 and the upper surface of the substrate 2 to the wider part of the same space, and thus, by virtue of an anchoring effect, the sealing member 9 is less prone to come out of the space between the upper surface of the substrate 2 and the lower surface of the frame body 5.

The sealing member 9 is filled into the region surrounded with the frame body 5 until its level is located below the level of the shoulder 5a. A light-transmittable insulating resin such for example as silicone resin, acrylic resin, or epoxy resin is used for the sealing member 9. For example, the thermal conductivity of the sealing member 9 is adjusted to fall in a range of 0.14 W/(m·K) or more and 0.21 W/(m·K) or less.

The wavelength conversion member 10 acts to convert the wavelength of light emitted from the light-emitting device 3. The wavelength conversion member 10 is designed to emit light upon excitation of fluorescent substances 11 contained therein caused by entrance of light emitted from the light-emitting device 3.

For example, the wavelength conversion member 10 is made of a light-transmittable insulating resin such as fluorine resin, silicone resin, acrylic resin, or epoxy resin, or light-transmittable glass, and the insulating resin or glass in use contains blue phosphors for producing fluorescence ranging in wavelength from 430 nm or more and 490 nm or less for example, green phosphors for producing fluorescence ranging in wavelength from 500 nm or more and 560 nm or less for example, yellow phosphors for producing fluorescence ranging in wavelength from 540 nm or more and 600 nm or less for example, and red phosphors for producing fluorescence ranging in wavelength from 590 nm or more and 700 nm or less for example. Where the light-transmittable glass is used for the wavelength conversion member 10, the hermeticity of the light-emitting apparatus 1 can be improved.

Moreover, the fluorescent substances 11 are dispersed evenly in the wavelength conversion member 10. The thermal conductivity of the wavelength conversion member 10 is adjusted to fall in a range of 0.1 W/(m·K) or more and 0.8 W/(m·K) or less, for example. The thermal expansion coefficient of the wavelength conversion member 10 is adjusted to fall in a range of $0.8 \times 10^{-5}$/K or more and $8 \times 10^{-5}$/K or less, for example. The refractive index of the wavelength conversion member 10 is adjusted to fall in a range of 1.3 or more and 1.6 or less, for example. For example, the refractive index of the wavelength conversion member 10 can be adjusted by controlling the compositional ratio of the wavelength conversion member 10.

In addition, the wavelength conversion member 10 is configured to have a uniform thickness throughout its entirety, and the thickness of the entire wavelength conversion member 10 is adjusted to fall in a range from 0.3 mm or more and 3 mm or less, for example. As used herein, the term "uniform thickness" is construed as encompassing thickness dimensional deviation ranging downwardly from 0.5 μm. By virtue of the uniformity in thickness of the wavelength conversion member 10, it is possible to adjust the quantity of light excited in the wavelength conversion member 10 to be uniform throughout the wavelength conversion member 10, and thereby suppress unevenness in luminance in the wavelength conversion member 10.

On the shoulder 5a of the frame body 5, the end of the wavelength conversion member 10 is fixed via an adhesive member 12. The adhesive member 12 is intended to permit the wavelength conversion member 10 to be attached fixedly to the frame body 5. The adhesive member 12 extends from the top of the end of the wavelength conversion member 10 to the region defined by the shoulder 5a of the frame body 5. Moreover, for example, a light-transmittable insulating resin such as silicone resin, acrylic resin, or epoxy resin, or light-transmittable glass is used for the adhesive member 12. The thermal conductivity of the adhesive member 12 is adjusted to fall in a range of 0.1 W/(m·K) or more and 0.8 W/(m·K) or less, for example. The thermal expansion coefficient of the adhesive member 12 is adjusted to fall in a range of $0.8 \times 10^{-5}$/K or more and $8 \times 10^{-5}$/K or less, for example.

In the light-emitting apparatus 1 related to this embodiment, since the level h1 of the lower surface of the light-emitting device 3 is higher than the level h2 of the lower surface of the frame body 5, it follows that light traveling sideward from the side surface of the light-emitting device 3 is likely to be reflected from the inner wall of the frame body 5. Thus, much of the light emitted from the light-emitting device 3 is reflected from the inner wall of the frame body 5 for further travel toward the wavelength conversion member 10. This makes it possible to increase light which is wavelength-converted in the wavelength conversion member 10 and then taken out of the light-emitting apparatus 1, and thereby achieve enhancement in brightness.

Moreover, the substrate 2 is to be symmetrically configured as viewed in section. However, due to the difference in thermal expansion coefficient between the substrate 2 and the wiring pattern, it will be difficult to impart a symmetrical sectional profile to the substrate 2. In this regard, if the wiring pattern is made symmetrical with respect to the center of the substrate 2, the substrate 2 can be warped symmetrically, but in this case the flexibility of the wiring pattern is limited. By way of contrast, in the light-emitting apparatus 1 according to this embodiment, since the flexibility of the wiring pattern in the substrate 2 can be ensured, even if the substrate 2 is asymmetrically configured, it is possible to adjust the level of the frame body 5 by causing deformation in the support member 4, and thereby arrange the light-emitting device 3 and the frame body 5 in proper relative positional relation. As a result, light can be taken out of the light-emitting apparatus 1 at a desired angle.

Moreover, the interlayer conductor 8a disposed in the substrate 2 is disposed along the interlayer within the substrate 2, wherefore heat resulting from thermal conversion entailed by light emission from the light-emitting device 3 can be transmitted from the light-emitting device 3 to many regions of the substrate 2 through the electrical conductor 8. Furthermore, the heat transmitted to the substrate 2 is dissipated to the exterior from the side surface or lower surface of the substrate 2, wherefore it never occurs that the interior of the light-emitting apparatus 1 is exposed to elevated temperatures with consequent interior damage.

Moreover, since the interlayer conductor 8a of the electrical conductor 8 extends from the region in overlapping relation to the light-emitting device 3 to the region in non-overlapping relation to the light-emitting device 3, it is possible to allow heat generated from the light-emitting device 3 to be readily transmitted from the light-emitting device 3 to the electrical conductor 8 with efficiency, and thereby prevent the light-emitting device 3 from being exposed to elevated temperatures effectively.

In addition, since the sealing member 9 is disposed in the region surrounded with the support member 4 and the frame body 5 from the upper surface of the light-emitting device 3 to the space between the lower surface of the frame body 5 and the upper surface of the substrate 2, it is possible to seal the light-emitting device 3 effectively, as well as to keep the strength of adhesion between the substrate 2 and the frame body 5 at an adequate level.

It should be understood that the application of the invention is not limited to the specific embodiment described heretofore, and that many modifications, variations, and improvements of the invention are possible without departing from the scope of the invention.

<Method for Manufacturing Light-Emitting Apparatus>

Now, a description will be given below as to a method for manufacturing the light-emitting apparatus 1 shown in FIG. 1. At first, the substrate 2 is prepared. For example, where the substrate 2 is made of sintered aluminum oxide, an organic binder, a plasticizer or a solvent and so forth are admixed in powder of raw materials such as aluminum oxide, silicon oxide, magnesium oxide and calcium oxide to obtain a mixture. A plurality of green sheets are produced from the mixture.

In addition, powder of high-melting-point metal such as tungsten or molybdenum is prepared, and an organic binder, a plasticizer or a solvent and so forth are admixed in this powder to obtain a metal paste. Then, the substrate 2 can be prepared by printing the metal paste in a predetermined metallization pattern onto a ceramic green sheet for constituting the substrate 2, laminating a plurality of the ceramic green sheets on top of each other, placing the stacked body on an external substrate warped so that its upper surface is convexly curved upwardly, and performing firing process.

Next, the frame body 5 is prepared. In forming the frame body 5, a ceramic material such as aluminum oxide, titanium oxide, zirconium oxide, yttrium oxide, or the like is prepared for use. Then, the frame body 5 can be prepared by charging the ceramic material into a mold for the frame body 5, drying the molded product, and then firing the dried product.

Next, the frame body 5 is positioned on the substrate 2, with the support member 4 interposed between them, so that the lower surface of the frame body 5 lies flat. Upon curing of the support member 4, the frame body 5 can be fixed on the substrate 2. At this time, the support member 4 is positioned so as not to attach to the entire lower surface of the frame body 5, with an end of the lower surface of the frame body 5 closer to the light-emitting device 3 left spaced from the upper surface of the substrate 2. Then, the light-emitting device 3 is mounted on the top of the central portion C of the substrate 2 in the region surrounded with the frame body 5.

The sealing member 9 made for example of silicone resin is filled into the region on the substrate 2 surrounded with the frame body 5 so that it finds its way also into the space between the lower surface of the frame body 5 and the upper surface of the substrate 2.

Next, the wavelength conversion member 10 is prepared. The wavelength conversion member 10 can be produced by mixing fluorescent substances in resin in an uncured state and shaping the mixture by means of sheet molding technique such for example as doctor blade, die coater, extrusion, spin coating, or dipping. Alternatively, the wavelength conversion member 10 can also be produced by charging an uncured wavelength conversion member 10 material in a mold and then taking it out of the mold following the completion of its curing.

After that, the thusly prepared wavelength conversion member 10 is positioned on the shoulder 5a of the frame body 5, and bonded to the frame body 5 via silicone resin acting as the adhesive member 12. In this way, the light-emitting apparatus 1 can be manufactured.

What is claimed is:

1. A light-emitting apparatus, comprising:
    a substrate warped as a whole of which a central portion is most highly raised;

a light-emitting device mounted on the central portion of the substrate;

a support member disposed on the substrate to surround the light-emitting device; and a frame body disposed on the support member to surround the light-emitting device, the frame body including part connected to the support member and part not connected to the support member, the part not connected to the support member being left spaced from an upper surface of the substrate, wherein a level of a lower surface of the light-emitting device is higher than a level of a lower surface of the frame body, a lower surface of the substrate is provided with a pair of metallization layers electrically connected to the light-emitting device, one of the pair of metallization layers is electrically connected to one electrode of the light-emitting device, and the other one of the pair of metallization layers is electrically connected to the other electrode of the light-emitting device, the pair of metallization layers are spaced apart on the lower surface of the substrate, the pair of metallization layers are disposed on an entirety of the lower surface of the substrate except for a region including the centerline of the substrate as seen in a plan view, the one of the pair of metallization layers extends from a region of the substrate in overlapping relation to the one electrode, to one end of the substrate, and the other one of the pair of metallization layers extends from a region of the substrate in overlapping relation to the other electrode, to the other end of the substrate, and the pair of metallization layers are arranged in symmetrical configuration when the lower surface of the substrate is seen in a plan view.

2. The light-emitting apparatus according to claim 1, wherein the substrate is asymmetrical about a center of the substrate as viewed in section.

3. The light-emitting apparatus according to claim 1, wherein the substrate is obtained by integrally firing a plurality of laminated ceramic layers, and the substrate has thereinside an electrical conductor for electrically connecting the metallization layers to the light-emitting device, and part of the electrical conductor connected to one of the pair of metallization layers is composed of a through conductor, and part of the electrical conductor connected to another one of the pair of metallization layers is composed of a through conductor and an interlayer conductor disposed along an interlayer within the substrate.

4. The light-emitting apparatus according to claim 3, wherein the interlayer conductor extends from a region in overlapping relation to the light-emitting device to a region in non-overlapping relation to the light-emitting device.

5. The light-emitting apparatus according to claim 1, wherein, in a region surrounded with the support member and the frame body, a sealing member extends from an upper surface of the light-emitting device to a space between the lower surface of the frame body and the upper surface of the substrate.

* * * * *